US006343103B1

(12) United States Patent
Lou et al.

(10) Patent No.: US 6,343,103 B1
(45) Date of Patent: Jan. 29, 2002

(54) METHODS AND APPARATUS FOR REPRESENTATION OF BRANCH METRICS IN A COMMUNICATION SYSTEM DECODER

(75) Inventors: Hui-Ling Lou; Rudiger L. Urbanke, both of Murray Hill, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/390,386

(22) Filed: Sep. 3, 1999

(51) Int. Cl.[7] .............................................. H04L 23/02
(52) U.S. Cl. ...................... 375/261; 375/262; 375/264; 375/265; 375/341; 714/792; 714/795; 714/796
(58) Field of Search ................................ 375/261, 262, 375/264, 265, 341; 714/792, 795, 796; 704/242

(56) References Cited

U.S. PATENT DOCUMENTS

| 5,727,029 A | * | 3/1998 | Jeon et al. | 375/341 |
| 5,881,075 A | * | 3/1999 | Kong et al. | 371/43.7 |
| 5,933,462 A | * | 8/1999 | Viterbi et al. | 375/341 |
| 6,141,384 A | * | 10/2000 | Wittig et al. | 375/240 |

OTHER PUBLICATIONS

G. Ungerboeck, "Trellis–Coded Modulation with Redundant Signal Sets, Part I: Introduction," IEEE Communications Magazine, vol. 25, No. 2, pp. 5–11, Feb. 1987.
G. Ungerboeck, "Trellis–Coded Modulation with Redundant Signal Sets, Part II: State of the Art," IEEE Communications Magazine, vol. 25, No. 2, pp. 12–21, Feb. 1987.
A.J. Viterbi, "Error Bounds for Convolutional Codes and an Asymptotically Optimum Decoding Algorithm," IEEE Trans. on Information Theory, vol. IT–13, No. 2, pp. 260–269, Apr. 1967.
G.D. Forney, Jr., "Maximum–Likelihood Sequence Detection in the Presence of Intersymbol Interference, " IEEE Trans. on Information Theory, vol. IT–18,No. 3, pp. 363–378, May 1972.
G.D. Forney, Jr., "The Viterbi Algorithm," IEEE Proceedings, vol. 61, No. 3, pp. 268–277, Mar. 1973.
H. Lou, "Implementing the Viterbi Algorithm. Fundamentals and real–time issues for processor designers," IEEE Signal Processing Magazine, vol. 12, pp. 42–52, Sep. 1995.
A.J. Viterbi, "A Pragmatic Approach to Trellis–Coded Modulation," IEEE Communications Magazine, pp. 11–19, Jul. 1989.

* cited by examiner

Primary Examiner—Stephen Chin
Assistant Examiner—Dac V. Ha
(74) Attorney, Agent, or Firm—Ryan, Mason & Lewis, LLP (57) ABSTRACT

A communication system decoder in which branch metrics are represented using linear distance. An illustrative embodiment for decoding a sequence of received symbols of a QPSK or QAM constellation includes a branch metric calculation unit, an add-compare-select unit, and a traceback unit. The branch metric unit computes branch metrics associated with transitions between states of a multi-stage trellis representation of a state machine. In accordance with the invention, each of the branch metrics correspond to a linear distance between a given one of the received symbols and its nearest codeword in a given stage of the trellis. The add-compare-select unit utilizes the branch metrics of a current stage, along with a previously-generated path metric, for comparison purposes in determining a survivor path and corresponding updated path metric for a current stage of the multi-stage trellis. The traceback unit utilizes the updated path metric to generate a corresponding decoded output. Advantageously, the add-compare-select unit of the decoder is configured such that it achieves a level of performance using the linear distance branch metrics which is equivalent to that achieved using squared distance branch metrics, while also substantially reducing the decoder complexity through the elimination of multiplication operations.

20 Claims, 5 Drawing Sheets

FIG. 8 ure usually required in the Viterbi algorithm only to compute the square Euclidean distances to obtain branch metrics associated with branches of the trellis. Look-up tables may also be used to obtain the square Euclidean distances. Depending on the trellis to be implemented, a typical look-up table can have a size of at least $2^9 \times 9 \sim 4$ k bits. For high bit-rate applications, parallel branch metric computations may be required. Duplications of multipliers or look-up tables to implement parallel branch
METHODS AND APPARATUS FOR REPRESENTATION OF BRANCH METRICS IN A COMMUNICATION SYSTEM DECODER

FIELD OF THE INVENTION

The invention relates generally to communication systems and, more particularly, to decoding techniques for use in such systems.

BACKGROUND OF THE INVENTION

Convolutional codes and bandwidth efficient Trellis Coded Modulation (TCM) are widely used in many different types of communication systems, including voice-band modems, Asymmetric Digital Subscriber Line (ADSL) systems, audio broadcasting systems, Fast or Gigabit Ethernet systems, cellular systems and wireless local loop systems. Convolutional codes are described in, e.g., G. C. Clark, Jr. and J. B. Cain, "Error Control Coding for Digital Communications," New York: Plenum, 1981, and TCM is described in, e.g., G. Ungerboeck, "Trellis-coded modulation with redundant signal sets part I," IEEE Communications Magazine, Vol. 25, February 1987, and G. Ungerboeck, "Trellis-coded modulation with redundant signal sets part II," IEEE Communications Magazine, Vol. 25, February 1987.

The Viterbi algorithm is an efficient maximum-likelihood sequence detection method for decoding convolutional and trellis codes transmitted over Additive White Gaussian Noise (AWGN) channels. The Viterbi algorithm is described in, e.g., A. J. Viterbi, "Error Bounds for Convolutional Codes and an Asymptotically Optimum Decoding Algorithm," IEEE Trans. on Information Theory, Vol. IT-13, April 1967, G. D. Forney, Jr., "Maximum-likelihood sequence detection in the presence of intersymbol interference," IEEE Trans. on Information Theory, Vol. IT-18, pp. 363–378, May 1972, and G. D. Forney, Jr., "The Viterbi algorithm," IEEE Proceedings, Vol. 61, pp. 268–278, March 1973. The Viterbi algorithm is currently used, almost exclusively, for decoding these codes in all practical applications. It is also known that for Rayleigh fading channels, if the Channel State Information (CSI) is known, the Viterbi Algorithm can still be the optimum detection method for detecting these codes, with minor modifications, as described in, e.g., E. Biglieri, D. Divsalar, P. J. McLane and M. K. Simon, "Introduction to Trellis-Coded Modulation with Applications," New York, N.Y.: Macmillan Publishing Company, 1991.

The Viterbi algorithm finds the most-likely codeword sequence in a code, as described by a trellis diagram, given a particular sequence of noisy symbols at the channel output. It is an application of dynamic programming and the search for the optimum path is done recursively. In the Viterbi algorithm for decoding convolutional and trellis codes, square Euclidean distance is the optimum branch metric for decoding sequences transmitted in AWGN channels and in Rayleigh fading channels when CSI is appropriately included.

Multiplications are generally required in the Viterbi algorithm only to compute the square Euclidean distances to obtain branch metrics associated with branches of the trellis. Look-up tables may also be used to obtain the square Euclidean distances. Depending on the trellis to be implemented, a typical look-up table can have a size of at least $2^9 \times 9 \sim 4$ k bits. For high bit-rate applications, parallel branch metric computations may be required. Duplications of multipliers or look-up tables to implement parallel branch metric computation can increase the decoder complexity tremendously, making such arrangements prohibitive for high bit-rate applications. Furthermore, the multipliers and the delay associated with accessing large look-up tables can become a processing bottleneck for a fully pipelined Viterbi decoder in high bit-rate applications.

As an alternative, absolute distances have been proposed for use as branch metrics. However, the use of absolute distances as branch metrics has the undesirable effect of reducing the performance of the Viterbi decoder. See H. Lou, "Implementing the Viterbi algorithm. Fundamentals and real-time issues for processor designers," IEEE Signal Processing Magazine, Vol. 12, pp. 42–52, September 1995.

A need therefore exists for a more efficient branch metric representation, which simplifies the decoder without compromising its performance.

SUMMARY OF THE INVENTION

The present invention provides an improved branch metric representation, based on linear distances, that overcomes the above-described decoder complexity problems of the prior art, while simultaneously avoiding any significant degradation in decoder performance.

An illustrative embodiment of the invention for decoding a sequence of received symbols includes a branch metric calculation unit, an add-compare-select unit, and a traceback unit. The branch metric unit computes branch metrics associated with transitions between states of a multi-stage trellis representation of a state machine. In accordance with the invention, each of the branch metrics correspond to a linear distance between a given one of the received symbols and its nearest codeword in a given stage of the trellis. The add-compare-select unit utilizes the branch metrics of a current stage, along with a previously-generated path metric, for comparison purposes in determining a survivor path and corresponding updated path metric for a current stage of the multi-stage trellis. The traceback unit utilizes the updated path metric to generate a corresponding decoded output.

Advantageously, the decoder is configured such that it achieves a level of performance using the linear distance branch metrics which is equivalent to that achieved using squared distance branch metrics, while the decoder complexity is reduced through the elimination of multiplication operations. More particularly, the invention allows adders rather than multipliers or large look-up tables to be used to obtain the branch metrics, thereby considerably simplifying the decoder. The techniques of the invention are suitable for use with convolutional and trellis codes for a variety of different modulation constellations, such as, e.g., QPSK (Quadrature Phase Shift Keying), 8-PSK (Phase-Shift-Keying), 16-QAM (Quadrature Amplitude Modulation), 32-QAM and larger constellations.

DETAILED DESCRIPTION OF THE INVENTION

Figure 1:
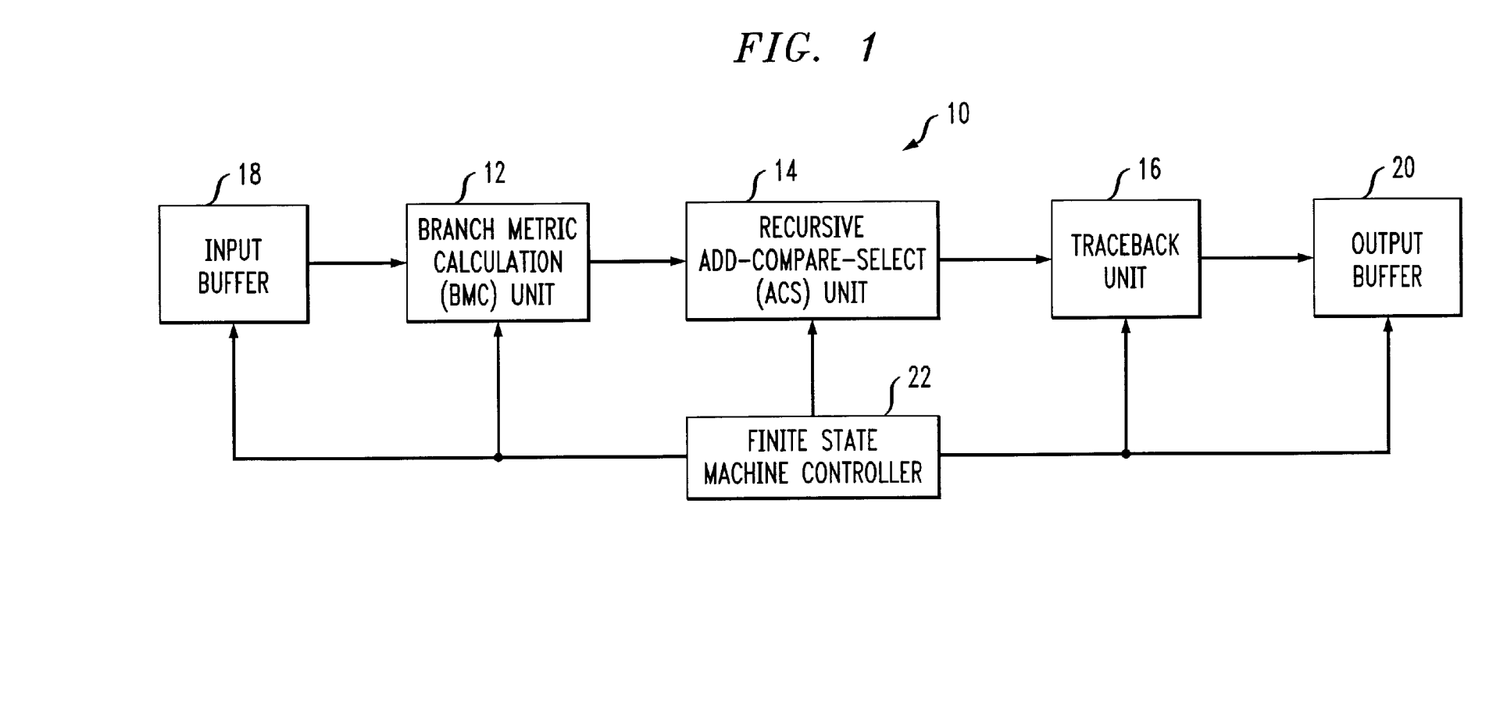
FIG. 1 is a block diagram of an exemplary Viterbi decoder in which the invention may be implemented.

FIG. 1 shows a Viterbi decoder 10 in which the invention may be implemented. The decoder 10 includes a branch metric calculator 12, a recursive ACS engine 14, and a traceback unit 16. Soft symbols are applied via an input buffer 18 to the branch metric calculator 12. The calculator 12 computes the branch metrics associated with all possible transitions for a given stage of the trellis. The ACS engine 14 is recursive, i.e., new path metrics computed for a given trellis stage depend on path metrics computed for the previous stage as well as the branch metrics associated with transitions from the previous stage to the next stage. The output of the ACS engine 14 is supplied to the traceback unit 16, and the resulting output is buffered in output buffer 20. A finite-state-machine controller 22 controls the operation of the various elements of the Viterbi decoder 10.

Unlike a conventional Viterbi decoder, which generally utilizes squared Euclidean distance to represent the branch metrics, the decoder 10 in accordance with the present invention uses linear distance to represent the branch metrics. As will be described in greater detail below, this allows the decoder complexity to be considerably reduced, without adversely affecting the performance of the decoder. For example, using the techniques of the invention, a relatively simple adder can be used in place of a more complex multiplier to compute a branch metric in the branch metric calculation unit 12 of FIG. 1. In accordance with the invention, linear distances are used as branch metrics for convolutional and trellis codes for a variety of different modulation constellations, such as, e.g., QPSK, 8-PSK, 16-QAM, 32-QAM and larger constellations.

The manner in which linear distances are used as branch metrics in the Viterbi decoder 10 of FIG. 1 will now be described with reference to FIGS. 2 through 6. The description will utilize the following notation:

- $y_{n,m}$ the $m^{th}$-dimensional received noisy symbol at decoding stage n (when $m=1$ $y_{n,m}=y_n$);
- $C_{i,j}$ the output symbol associated with the transition from state i to state j (this symbol is also referred to as a codeword for convolutional codes and a coset number for trellis codes);
- $p_{i,j,n,m}$ the nearest codeword in coset $C_{i,j}$ of trellis codes to the $m^{th}$-dimensional received symbol, $y_{n,m}$, at decoding stage n (when $m=1$, $p_{i,j,n,m}=p_{i,j,n}$);
- $B_{i,j,n,m}$ $m^{th}$-dimensional branch metric for the transition from state i to state j at decoding stage n;

$$B_{i,j,n} \equiv \sum_{m=1}^{N} B_{i,j,n,m} \text{ (when } m=1, B_{i,j,n,m} = B_{i,j,n}\text{)};$$

$M_{j,n}$ the path metric for state j at decoding stage n; and
$\{i\}$ the set of states that have transitions to state j.

At each decoding stage, the Viterbi algorithm computes the path that has the minimum path metric coming into each state. For example, to find the survivor path coming into state j at decoding stage n, the Viterbi algorithm computes $$M_{j,n} = \min_{\{i\}}[M_{i,n-1} + B_{i,j,n}]. \quad (1)$$

As previously noted, for optimal Viterbi algorithm performance in AWGN, the branch metric of a given transition is defined as the squared distance between the noisy symbol and the output symbol of the transition, as described in the above-cited G. D. Forney, Jr. references:

$$B_{i,j,n} = (y_n - C_{i,j})^2. \quad (2)$$

Figure 2:
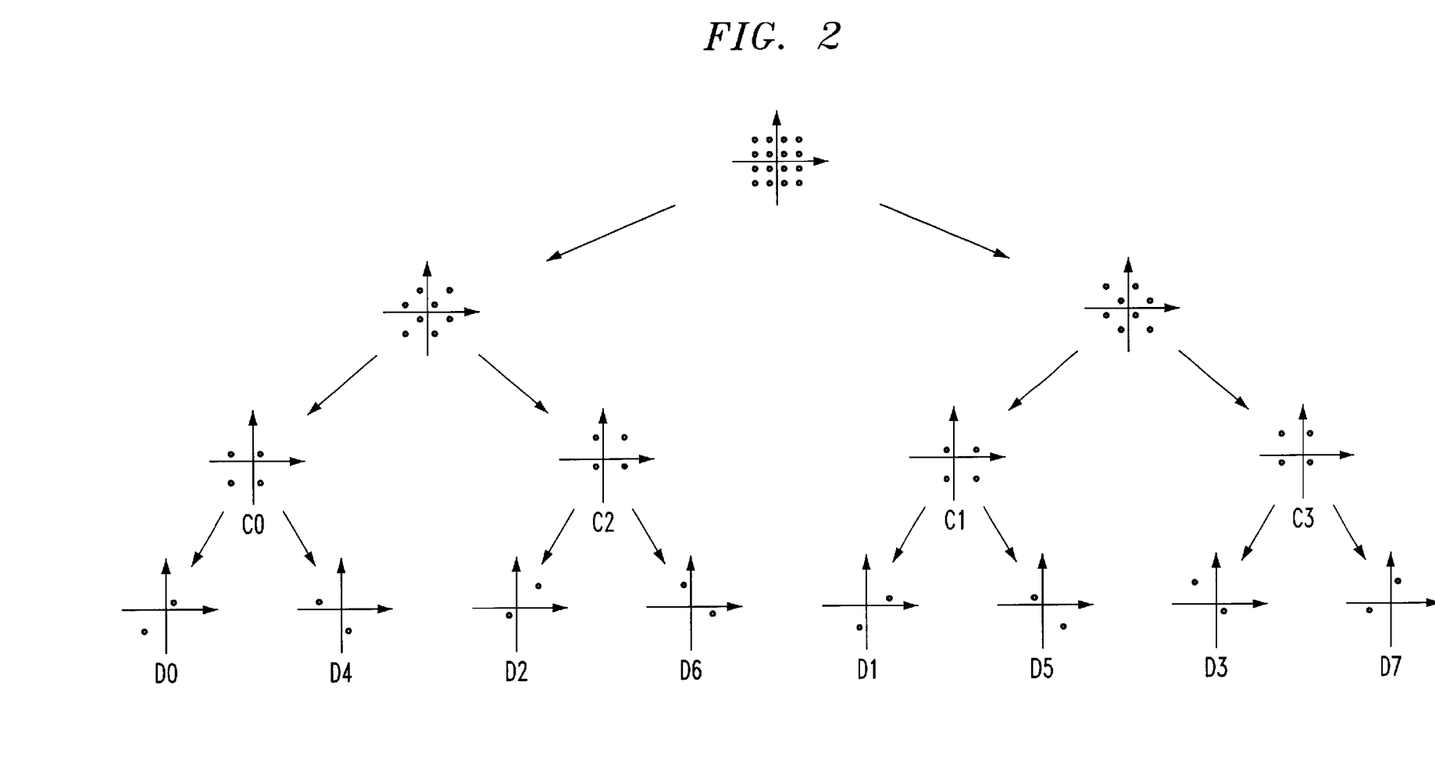
FIG. 2 illustrates C-level and D-level partitioning of a 16-QAM constellation.

For trellis codes, $C_{i,j}$ is a coset number that usually contains more than one symbol in the set. FIG. 2 is an example that illustrates the partitioning of a 16-QAM constellation in accordance with a trellis code. The partitioning generates a number of cosets, including C-level and D-level cosets as shown. The C-level cosets, i.e., cosets C0–C3, each have 4 codewords, and the D-level cosets, i.e., cosets D0–D7, have 2 codewords in each coset. Given a received symbol $y_n$, the codeword that is closest in Euclidean distance to $y_n$ has to be computed first. This closest codeword in coset $C_{i,j}$ is denoted by $p_{i,j,n}$. The branch metric in this case is $$B_{i,j,n} = (y_n - p_{i,j,n})^2. \quad (3)$$

In the Viterbi algorithm, comparisons between the path metrics are required to determine the survivor path for each state. Thus, one is generally only concerned with the differences between the path metrics. That is, at decoding stage n, if the two paths to be compared to, coming into state j, are coming out of states i and k, then the result of the comparison depends only on the difference $$\Delta M = (M_{i,n-1} + B_{i,j,n}) - (M_{k,n-1} + B_{k,j,n}). \quad (4)$$

In general, $y_n$ can be multi-dimensional. For higher-dimensional trellis codes, even though the search for the nearest codewords may not be done one dimension at a time, once the multi-dimensional nearest codeword is computed, the branch metric can be computed one dimension at a time and then the sum of these one-dimensional branch metrics is the branch metric for the multi-dimensional symbol. More particularly, if $y_n$ is N-dimensional, i.e., $y_n = (y_1, y_2, \ldots, y_N)$, and $B_{i,j,n,m}$ denotes the $m^{th}$-dimension branch metric for the transition from state i to state j at recursion n, then the branch metric for the N-dimensional symbol is $$B_{i,j,n} = \sum_{m=1}^{N} B_{i,j,n,m}.$$

To determine the survivor path, comparison of the path metrics of the path from state i to state j and that of state k to state j has to be made. That is, $$\Delta M = (M_{i,n-1} + B_{i,j,n}) - (M_{k,n-1} + B_{k,j,n}) \quad (5)$$

$$= (M_{i,n-1} - M_{k,n-1}) + \sum_{m=1}^{N} B_{i,j,n,m} - \sum_{m=1}^{N} B_{k,j,n,m}$$

$$= (M_{i,n-1} - M_{k,n-1}) + \sum_{m=1}^{N} [B_{i,j,n,m} - B_{k,j,n,m}]$$

$$= (M_{i,n-1} - M_{k,n-1}) +$$

$$\sum_{m=1}^{N} (y_{n,m} - p_{i,j,n,m})^2 - (y_{n,m} - p_{k,j,n,m})^2$$

$$= (M_{i,n-1} - M_{k,n-1}) + \sum_{m=1}^{N} -2y_{n,m}(p_{i,j,n,m} - p_{k,j,n,m})^2 +$$

$$p_{i,j,n,m}^2 - p_{k,j,n,m}^2$$

$$= M_{i,n-1} - M_{k,n-1} + \sum_{m=1}^{N} (p_{k,j,n,m} - p_{i,j,n,m})$$

$$[(y_{n,m} - p_{i,j,n,m}) + (y_{n,m} - p_{k,j,n,m})]$$

$$= M_{i,n-1} - M_{k,n-1} + \Delta B,$$

where $$\Delta B \equiv \sum_{m=1}^{N} (p_{k,j,n,m} - p_{i,j,n,m})[(y_{n,m} - p_{i,j,n,m}) + (y_{n,m} - p_{k,j,n,m})] \quad (6)$$

$$\equiv \sum_{m=1}^{N} \text{sign}(p_{k,j,n,m} - p_{i,j,n,m}) |p_{k,j,n,m} - p_{i,j,n,m}|$$

$$[(y_{n,m} - p_{i,j,n,m}) + (y_{n,m} - p_{k,j,n,m})].$$

The comparison rule is $$\Delta M \begin{cases} \geq 0 & \text{for } (M_{i,n-1} + B_{i,j,n}) \geq (M_{k,n-1} + B_{k,j,n}) \\ < 0 & \text{for } (M_{i,n-1} + B_{i,j,n}) < (M_{k,n-1} + B_{k,j,n}). \end{cases} \quad (7)$$

Figure 3:
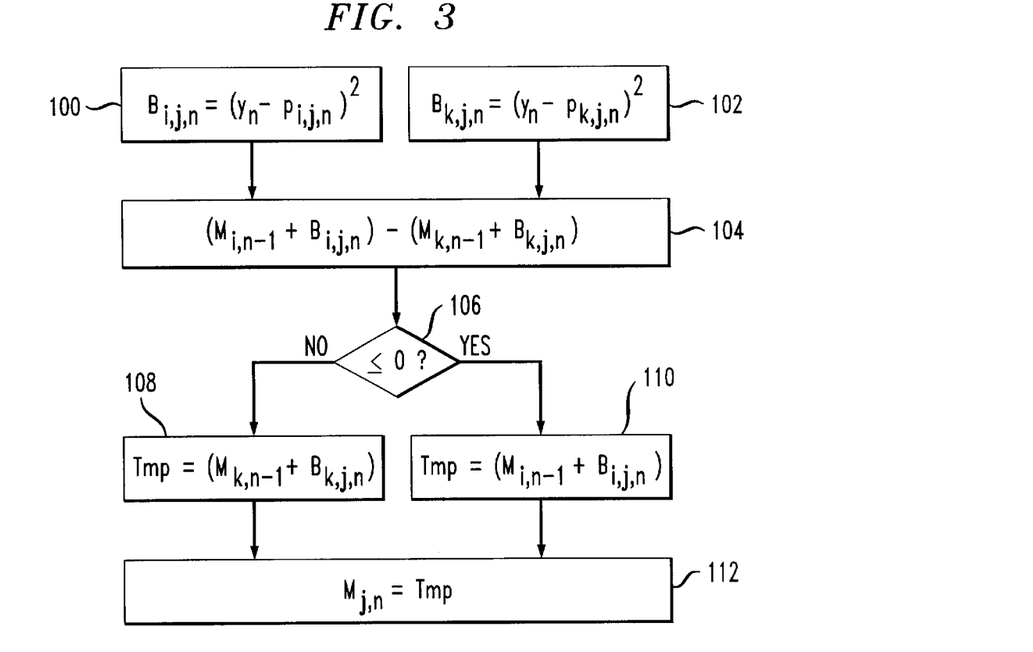
FIG. 3 is a flow diagram showing branch metric and survivor path computations using conventional square Euclidean distance branch metrics.

FIG. 3 is a flow diagram illustrating the above-described processing based on squared Euclidean distance, assuming a one-dimensional symbol $y_n$. Steps 100 and 102 show the calculation of two different squared distance branch metrics, and step 104 shows the computation of the difference between the new path metrics generated using those branch metrics in accordance with Equation (4). Step 106 implements the comparison of Equation (7), and steps 108 and 110 each assign one of the two different possible new path metrics to a temporary variable Tmp. Step 112 assigns the selected version of the Tmp variable to the value of the new path metric for decoding stage n.

It will be shown below that the term $|p_{k,j,n,m} - p_{i,j,n,m}|$ Equation (6) is a constant during comparison for all branches coming into each state for codes of practical interest. Furthermore, it will be shown that the term sign $(p_{k,j,n,m} - p_{i,j,n,m})$, in Equation (6), can be determined by the sign of $(y_{n,m} - p_{i,j,n,m})$ and $(y_{n,m} - p_{k,j,n,m})$. Therefore, during comparison, linear distances between the received symbol and the nearest codewords (e.g.($y_{n,m} - p_{k,j,n,m}$)) can be used to represent the branch metrics. As a result, no squaring or multiplication operation is required in the critical path of the add-compare-select process to search the survivor path for each state.

Figure 4:
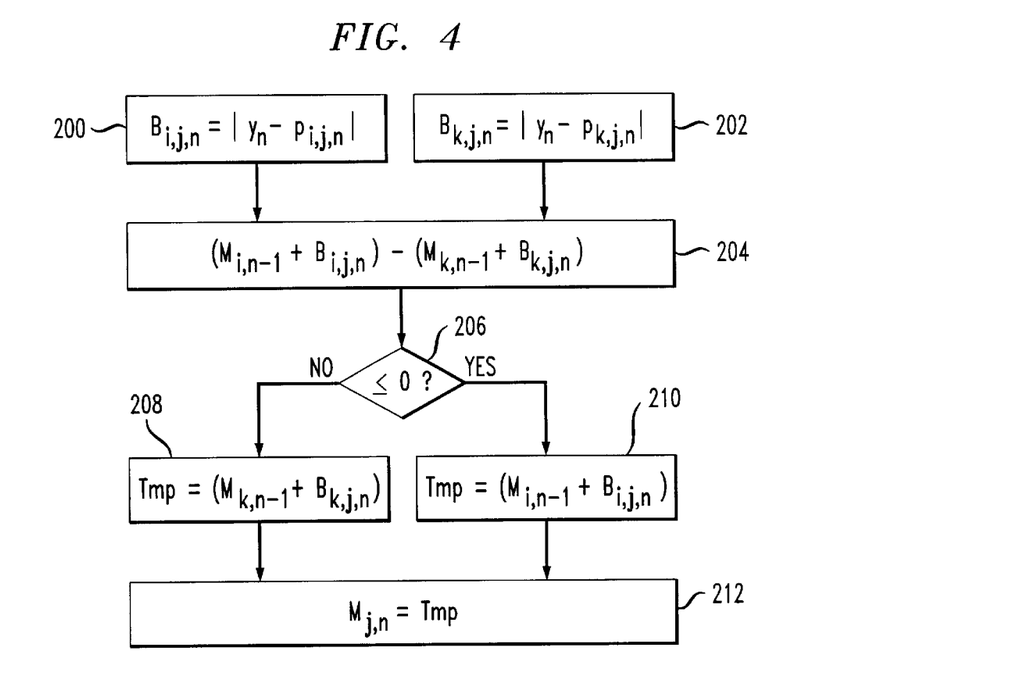
FIG. 4 is a flow diagram showing branch metric and survivor path computations using linear distance branch metrics in accordance with the invention.

FIG. 4 is a flow diagram illustrating the above-described processing using linear distance branch metrics in accordance with the invention, also assuming a one-dimensional symbol $y_n$. Steps 200 and 202 show the calculation of two different linear distance branch metrics, and step 204 shows the computation of the difference between the new path metrics generated using those branch metrics in accordance with Equation (4). Step 206 implements the comparison of Equation (7), and steps 208 and 210 each assign one of the two different possible new path metrics to a temporary variable Tmp. Step 212 assigns the selected version of the Tmp variable to the value of the new path metric for decoding stage n.

In the remaining description, the above-described linear distance branch metric approach is applied to convolutional codes with a QPSK constellation (Case I), trellis codes with C-level and D-level partitioning and infinite constellations (Case II), and trellis codes with C-level and D-level partitioning and finite constellations (Cases III). Although these categories cover many codes of practical interest, it will be apparent to those skilled in the art that the techniques of the present invention are also applicable to other types of codes.

Case I: QPSK Constellations

For a QPSK constellation with $p_{i,j} \in \{\pm 1, \pm j\}$, and focusing on the symbol one dimension at a time, $p_{i,j,1} \in \{\pm 1\}$. From Equation (6) and denoting the x-dimension of the received symbol by $y_{n,1}$, $$\Delta B = \text{sign}(p_{k,j,n,1} - p_{i,j,n,1})|p_{k,j,n,1} - p_{i,j,n,1}|[(y_{n,1} - p_{i,j,n,1}) + (y_{n,1} - p_{k,j,n,1})] \quad (8)$$

Since $|p_{k,j,n,1} - p_{i,j,n,1}| = 2$ for all pairs of codewords to be compared to, $\Delta M$ can be divided by this factor without changing the comparison results. Thus, $$\Delta B = \begin{cases} 0 & \text{for } p_{k,j,n,1} = p_{i,j,n,1} \\ \text{sign}(p_{k,j,n,1} - p_{i,j,n,1})(2y_{n,1}) & \text{for } p_{k,j,n,1} \neq p_{i,j,n,1} \end{cases} \quad (9)$$

$$= \begin{cases} 0 & \text{for } p_{k,j,n,1} = p_{i,j,n,1} \\ \text{sign}(p_{k,j,n,1} - p_{i,j,n,1})(y_{n,1}) - \text{sign}(p_{i,j,n,1} - p_{k,j,n,1})(y_{n,1}) & \text{for } p_{k,j,n,1} \neq p_{i,j,n,1} \end{cases}$$

Therefore, during the search for the survivor path, the one-dimensional branch metric from state i to state j at time n can be represented as $$B_{i,j,n,1} = -y_{n,1} p_{i,j,n,1} = \begin{cases} -y_{n,1} & \text{for } p_{i,j,n,1} = 1 \\ y_{n,1} & \text{for } p_{i,j,n,1} = -1 \end{cases} \quad (10)$$

$B_{i,j,n,2}$ is computed in a similar manner. To search for the survivor path, compute $$\Delta M = M_{i,n-1} + \sum_{m=1}^{2} B_{i,j,n,m} - \left( M_{k,n-1} + \sum_{m=1}^{2} B_{k,j,n,m} \right). \quad (11)$$

Thus, if the path from state i to state j is the optimum path coming into state j at decoding stage n, the updated path metric should be, $$M_{j,n} = M_{i,n-1} + B_{i,j,n}. \quad (12)$$

Case II: Trellis Codes with Infinite Constellations

Figure 5:
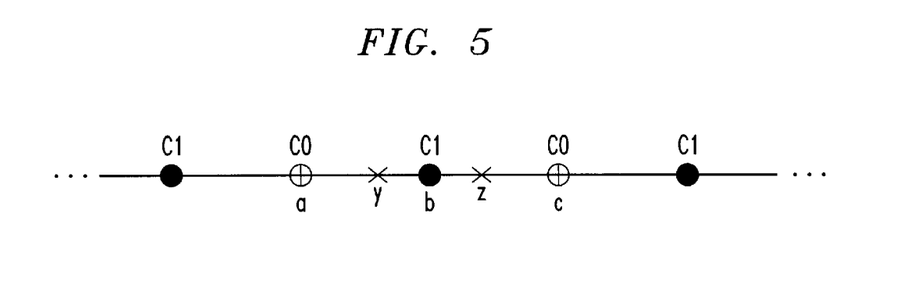
FIGS. 5 and 7 show examples of one-dimensional infinite and finite constellations, respectively.

FIG. 5 illustrates an infinite trellis code constellation. For each dimension, the two cosets to be compared to, denoted by C0 and C1, have equally spaced codewords, with codewords in coset C0 located on the decision boundaries of codewords in coset C1 and vice versa, as shown in FIG. 5. In this case, the received symbol in each dimension, $y_n$, will always fall between the two nearest codewords from the two cosets. Furthermore, the term $|p_{k,j,n} - p_{i,j,n}|$ in Equation (6) is a constant to which all branch metrics are compared. Thus, $\Delta M$ can be divided by this constant value without changing the comparison result.

To determine the term sign $(p_{k,j,n} - p_{i,j,n})$ in Equations (5) and (6), one must know if $p_{i,j,n}$ is larger than or smaller than $p_{k,j,n}$. For example, in FIG. 5, if $y_n = y$, then $p_{i,j,n}$ (of C0)=a and $p_{k,j,n}$ (of C1)=b. Thus, sign $(p_{k,j,n} - p_{i,j,n}) \geq 0$. Note that in this case, $$\Delta B = [\text{sign}(b-a)(y-a) + \text{sign}(b-a)(y-b)]$$
$$= [|(y-a)| - |(y-b)|].$$

On the other hand, if $y_n = z$, then $p_{i,j,n}$ (of C0)=c and $p_{k,j,n}$ (of C1)=b. Thus, sign $(p_{k,j,n} - p_{i,j,n}) \leq 0$. In this case, $$\Delta B = [\text{sign}(b-c)(z-c) + \text{sign}(b-c)(z-b)]$$
$$= [|(z-c)| - |(z-b)|].$$

Since exactly one of these two cases will occur, it follows that it is not necessary to compute the term sign $(p_{k,j,n} - p_{i,j,n})$ explicitly. Thus, to determine the survivor path given an m-dimensional symbol, we compute $$\Delta M = (M_{i,n-1} - M_{k,n-1}) + \sum_{m=1}^{N} |y_{n,m} - p_{i,j,n,m}| - \sum_{m=1}^{N} |y_{n,m} - p_{k,j,n,m}|, \quad (13)$$

where $$B_{i,j,n} = \sum_{m=1}^{N} |y_{n,m} - p_{i,j,n,m}|. \quad (14)$$

Applying the properties derived above to C cosets using C-level partitioning (FIG. 2), it can be seen that for any pair of C cosets, codewords in one coset are either on the decision boundaries of the codewords in the other cosets or exactly on the same position as the other cosets in each dimension. Thus, the properties derived above can be used to search for the survivor path for each state:

$$M_{j,n} = M_{i,n-1} + B_{i,j,n}. \quad (15)$$

Trellis codes using D-level partitioning have either even numbered cosets or odd numbered cosets coming into each state. Thus, the properties derived above are valid for all cosets to be compared to at each decoding stage. However, even though e.g., the branch metric of coset D0 will not be compared to the branch metric of coset D3 at a given decoding stage, if they are associated with the survived paths in the current decoding stage, they may be compared to each other at the next decoding stage. Codewords in D3 do not coincide with the decision boundaries of the codewords in D0. Thus, the received symbol in each dimension, $y_n$, may not always be between two nearest codewords in D0 and D3. Furthermore, the term $|p_{k,j,n} - p_{i,j,n}|$ in Equation (5) is dependent on the location of $y_n$. Thus, one cannot divide $\Delta M$ by $|p_{k,j,n} - p_{i,j,n}|$, even though one can divide $\Delta B$ by the same term at each decoding stage. Therefore, Equation (13) can be used to find the survivor path for each state. However, if the path from state i to state j is the optimum path coming into state j at decoding stage n, and given an m-dimensional symbol, the updated path metric should be, $$M_{j,n} = M_{i,n-1} + \sum_{m=1}^{N} (y_{n,m} - p_{i,j,n,m})^2,$$

which may be written as $$M_{j,n} = M_{i,n-1} + \sum_{m=1}^{N} (p_{i,j,n,m}^2 - 2y_{n,m} p_{i,j,n,m}), \quad (16)$$

since $y_{n,m}^2$ is common to all the path metrics. Further, the term $(p_{i,j,n,m}^2 - 2y_{n,m} p_{i,j,n,m})$ of all path metrics can be divided by 2 without changing the comparison results. That is, $$M_{j,n} = M_{i,n-1} + \sum_{m=1}^{N} \left( \frac{p_{i,j,n,m}^2}{2} - y_{n,m} p_{i,j,n,m} \right) \quad (17)$$
$$= M_{i,n-1} + \sum_{m=1}^{N} \left( p_{i,j,n,m} \left( \frac{p_{i,j,n,m}}{2} - y_{n,m} \right) \right).$$

Even though the term $$\left( \frac{p_{i,j,n,m}^2}{2} - y_{n,m} p_{i,j,n,m} \right)$$

is to be computed in this case, it need be computed only once per state and it can be done in parallel to the add-compare-select process to search for the survivor path for each state. That is, it is not in the critical path of the survivor path search for each state. Furthermore, $p_{i,j,n,m}$ is a constellation point, i.e., a constant, and the multiplication of $y_{n,m}$ or $$\left( \frac{p_{i,j,n,m}}{2} - y_{n,m} \right)$$

with a constellation point can be implemented without the need for multiplication operations, e.g., as described in U.S. patent application Ser. No. 09/390,389 of H. Lou and M. Rupp, entitled "Multiplier-free Methods and Apparatus for Signal Processing in a Digital Communication System" and filed concurrently herewith.

Figure 6:
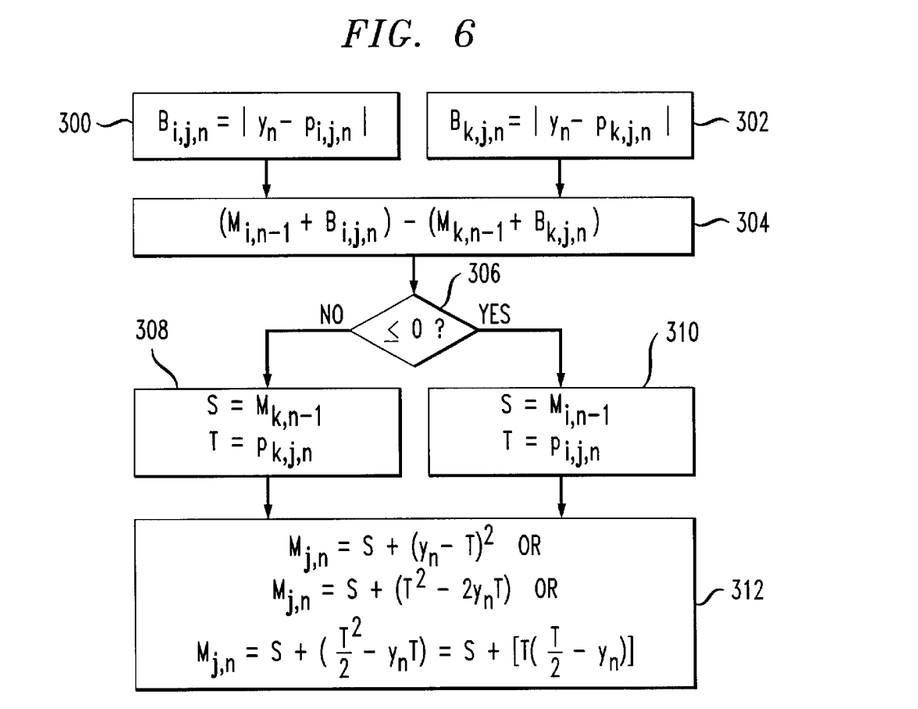
FIGS. 6 and 8 are flow diagrams showing branch metric and survivor path computations using linear distance branch metrics in accordance with the invention, for infinite and finite trellis constellations, respectively.

FIG. 6 is a flow diagram illustrating the above-described processing for an infinite trellis code constellation using linear distance branch metrics in accordance with the invention, and assuming a one-dimensional symbol $y_n$. Steps 300 and 302 show the calculation of two different linear distance branch metrics, and step 304 shows the computation of the difference between the two possible new path metrics generated using those branch metrics. Step 306 implements the comparison of the two possible new path metrics based on their difference, and steps 308, 310 and 312 select a particular one of these two possible new path metrics for decoding stage n. The variables S and T represent temporary variables defined as shown in steps 308 and 310.

Case III: Trellis Codes with Finite Constellations

Figure 7:
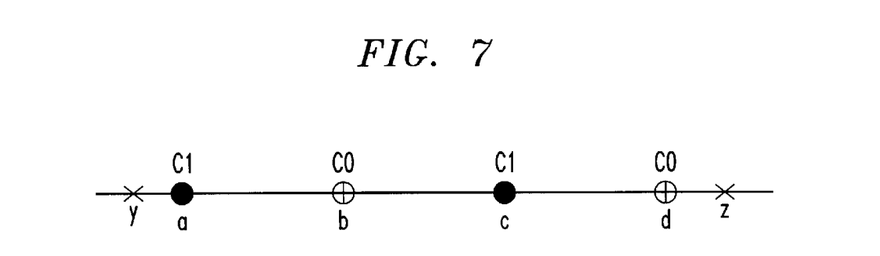

For a finite trellis code constellation as shown in FIG. 7, the nearest codewords from the two cosets can both have values smaller than $y_n$ (e.g., $y_n = z$) or larger than $y_n$ (e.g., $y_n = y$). For these cases, it is known a priori which codeword in which coset has a smaller value, given the constellation. For example, in this example, the nearest codeword in C0 will have a smaller value than that of C1. Thus, the appropriate sign for the term sign $(p_{k,j,n}-p_{i,j,n})$ in Equation (6) is known once these cases are detected. To determine if these cases have occurred, note that $$(y_n-p_{i,j,n}) \geq 0 \text{ and } (y_n-p_{k,j,n}) \geq 0 \text{ for } y_n \geq p_{i,j,n} \text{ and } y \geq p_{k,j,n}$$

$$(y_n-p_{i,j,n}) \leq 0 \text{ and } (y_n-p_{k,j,n}) \leq 0 \text{ for } y_n \geq p_{i,j,n} \text{ and } y \geq p_{k,j,n}$$

$$(y_n-p_{i,j,n}) \geq 0 \text{ and } (y_n-p_{k,j,n}) \leq 0 \text{ for } p_{i,j,n} \leq y_n \leq p_{k,j,n} \qquad (18)$$

Thus, by looking at the signs of $p_{i,j,n}$ and $p_{k,j,n}$, one can determine where the received value $y_n$ is with respect to the two nearest codewords. On the other hand, when the received symbol $y_n$ is between the two nearest codewords, it is known that $(\text{sign}(y_n-p_{i,j,n}) \oplus \text{sign}(y_n-p_{k,j,n}))=1$. Furthermore, if sign $(y_n-p_{i,j,n})=1$, $p_{i,j,n} > p_{k,j,n}$ and thus sign $(p_{k,j,n}-p_{i,j,n})=1$.

In summary, for an m-dimensional received symbol at decoding stage n, if C0 is associated with the transition from state i to state j and C1 is associated with the transition from state k to state j, and if $s_i=\text{sign }(y_{n,m}-p_{i,j,n,m})$, then to search for the survivor path if $((s_i \oplus s_k)=1 \text{ and } s_i=1)$, compute $$\Delta M = (M_{i,n-1} - M_{k,n-1}) - \sum_{m=1}^{N} [(y_{n,m} - p_{i,j,n,m}) + (y_{n,m} - p_{k,j,n,m})],$$

and otherwise compute $$\Delta M = (M_{i,n-1} - M_{k,n-1}) + \sum_{m=1}^{N} [(y_{n,m} - p_{i,j,n,m}) + (y_{n,m} - p_{k,j,n,m})].$$

Since the sign of the branch metric comparison is dependent on the two cosets to be compared to, one has to accumulate the true branch metric once the survivor path is determined for each state. That is, if the path from state i to state j is the optimum path coming into state j at decoding stage n, the updated path metric should be, $$M_{j,n} = M_{i,n-1} + \sum_{m=1}^{N} \left( \frac{p_{i,j,n,m}^2}{2} - y_{n,m} p_{i,j,n,m} \right) \qquad (19)$$

$$= M_{i,n-1} + \sum_{m=1}^{N} \left( p_{i,j,n,m} \left( \frac{p_{i,j,n,m}}{2} - y_{n,m} \right) \right).$$

Similar to the case for trellis codes with D-level partitioning and infinite constellations, the term $$\left( p_{i,j,n,m} \left( \frac{p_{i,j,n,m}}{2} - y_{n,m} \right) \right)$$

is not in the critical path of the add-compare-select process and it need be computed only once per state. Furthermore, the computation of the term is simple because $p_{i,j,n,m}$ is a constellation point, and the computation can therefore be implemented without multiplication operations, as previously noted.

Figure 8:
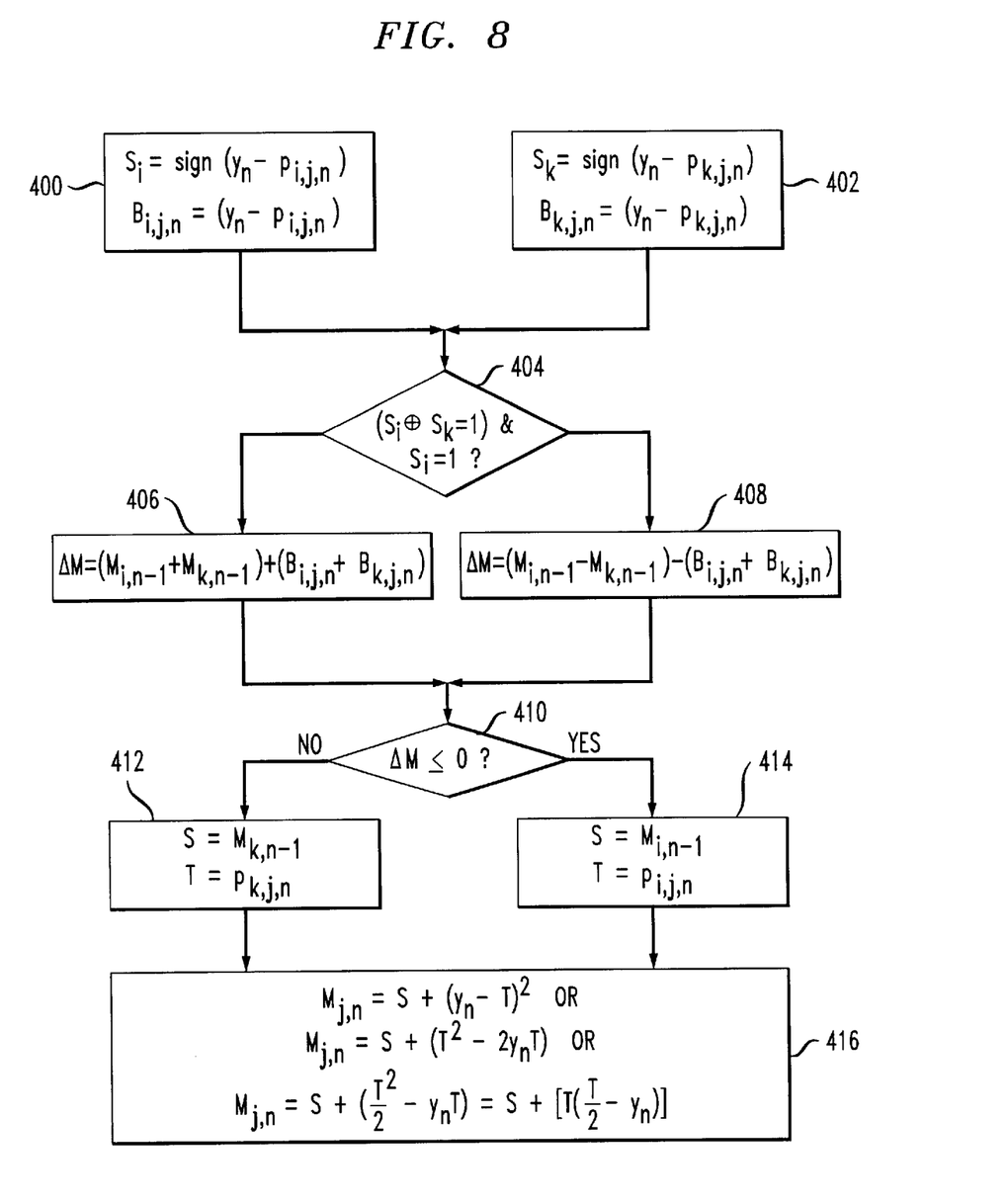

FIG. 8 is a flow diagram illustrating the above-described processing for a finite trellis constellation using linear distance branch metrics in accordance with the invention. Like the flow diagrams of FIGS. 3, 4 and 6, the FIG. 8 diagram also assumes a one-dimensional symbol $y_n$. Steps 400 and 402 show the calculation of two different linear distance branch metrics, and steps 404, 406 and 408 implement the computation of the difference between the two possible new path metrics generated using those branch metrics. Step 410 implements the comparison of the two possible new path metrics, and steps 412, 414 and 416 implement the selection of a particular one of the two possible path metrics for decoding stage n. The variables S and T represent temporary variables defined as shown in steps 412 and 414.

It should be understood that in the above-described illustrative embodiments, the linear distance branch metrics are generally used for comparison purposes in the add-compare-select unit. In other words, the linear distance branch metrics are used in comparing different candidate paths in the process of determining a survivor path. However, the add-compare-select unit may use other forms of the metrics for the update operations, e.g., conventional square distance metrics. This is apparent from the squared terms in the path metric update operations set forth in, e.g., Equations (16) and (17) above.

The above-described illustrative embodiments may be implemented in hardware, software or combinations of hardware and software. For example, the computations referred to above may be implemented using hardware elements of a decoder such as Viterbi decoder 10 of FIG. 1, an application-specific integrated circuit (ASIC) or any other digital data processing device for use in, e.g., a communication system receiver.

Although the illustrative embodiments of the present invention have been described herein with reference to the accompanying drawings, it is to be understood that the invention is not limited to those precise embodiments, and that various other changes and modifications may be affected therein by one skilled in the art without departing from the scope of the invention as set forth in the appended claims.

What is claimed is:

1. A decoder for processing a sequence of received symbols, the decoder comprising:
   a branch metric calculation unit for computing branch metrics associated with transitions between states of a multi-stage trellis representation of a state machine, wherein at least a subset of the branch metrics correspond to a linear distance between a given one of the received symbols and its nearest codeword in a given stage of the trellis;
   an add-compare-select unit having an input coupled to an output of the branch metric calculation unit, the add-compare-select unit utilizing the linear distance branch metrics generated by the branch metric calculation unit for a current stage of the trellis, and a path metric generated for a previous stage of the trellis, for comparison purposes in determining a survivor path and corresponding updated path metric for the current stage of the trellis, wherein the add-compare-select unit is configured such that it achieves a level of performance using the linear distance branch metrics which is substantially equivalent to that achieved using squared distance branch metrics; and
   a traceback unit having an input coupled to an output of the add-compare-select unit, the traceback unit generating an output for a given stage of the multi-stage trellis based on the path metric determined for that stage.

2. The decoder of claim 1 wherein the symbols are generated in accordance with a QPSK modulation constellation.

3. The decoder of claim 1 wherein the symbols are generated in accordance with a QAM modulation constellation.

4. The decoder of claim 1 wherein a given one of the linear distance branch metrics corresponding to a transition from state i to state j in stage n of the trellis is represented as $$B_{i,j,n,1} = -y_{n,1} p_{i,j,n,1} = \begin{cases} -y_{n,1} & \text{for } p_{i,j,n,1} = 1 \\ y_{n,1} & \text{for } p_{i,j,n,1} = -1, \end{cases}$$

where $y_{n,m}$ denotes an $m^{th}$-dimensional received symbol at stage n, $p_{i,j,n,m}$ denotes a nearest codeword in a coset $C_{i,j}$ to the $m^{th}$-dimensional received symbol, $y_{n,m}$, at stage n, and $B_{i,j,n,m}$ denotes an $m^{th}$-dimensional branch metric for the transition from state i to state j at stage n.

5. The decoder of claim 4 wherein the survivor path is determined by computing $$\Delta M = M_{i,n-1} + \sum_{m=1}^{2} B_{i,j,n,m} - \left( M_{k,n-1} + \sum_{m=1}^{2} B_{k,j,n,m} \right),$$

where $M_{j,n}$ denotes a path metric for state j at stage n and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{2} B_{i,j,n,m}.$$

6. The decoder of claim 1 wherein a given one of the linear distance branch metrics corresponding to a transition from state i to state j in stage n of the trellis is represented as $$B_{i,j,n} = \sum_{m=1}^{N} |y_{n,m} - p_{i,j,n,m}|,$$

where $y_{n,m}$ denotes an $m^{th}$-dimensional received symbol at stage n, $p_{i,j,n,m}$ denotes a nearest codeword in a coset $C_{i,j}$ to the $m^{th}$-dimensional received symbol, $y_{n,m}$, at stage n, and $B_{i,j,n}$ denotes a branch metric for the transition from state i to state j at stage n.

7. The decoder of claim 6 wherein the survivor path is determined by computing $$\Delta M = (M_{i,n-1} - M_{k,n-1}) + \sum_{m=1}^{N} |y_{n,m} - p_{i,j,n,m}| - \sum_{m=1}^{N} |y_{n,m} - p_{k,j,n,m}|,$$

where $M_{j,n}$ denotes a path metric for state j at stage n, k denotes a numerical index, and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{N} B_{i,j,n,m},$$

where $B_{i,j,n,m}$ denotes an $m^{th}$-dimensional branch metric for the transition from state i to state j at stage n.

8. The decoder of claim 6 wherein the survivor path is determined by computing $$\Delta M = (M_{i,n-1} - M_{k,n-1}) + \sum_{m=1}^{N} |y_{n,m} - p_{i,j,n,m}| - \sum_{m=1}^{N} |y_{n,m} - p_{k,j,n,m}|,$$

where $M_{j,n}$ denotes a path metric for state j at stage n, k denotes a numerical index, and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{N} \left( p_{i,j,n,m} \left( \frac{p_{i,j,n,m}}{2} - y_{n,m} \right) \right).$$

9. The decoder of claim 6 wherein the survivor path is determined by computing one of $$\Delta M = (M_{i,n-1} - M_{k,n-1}) - \sum_{m=1}^{N} ((y_{n,m} - p_{i,j,n,m}) + (y_{n,m} - p_{k,j,n,m}))$$

or $$\Delta M = (M_{i,n-1} - M_{k,n-1}) + \sum_{m=1}^{N} ((y_{n,m} - p_{i,j,n,m}) + (y_{n,m} - p_{k,j,n,m})),$$

where $M_{j,n}$ denotes a path metric for state j at stage n, k denotes a numerical index, and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{N} \left( p_{i,j,n,m} \left( \frac{p_{i,j,n,m}}{2} - y_{n,m} \right) \right).$$

10. An apparatus comprising:
a decoder for processing a sequence of received symbols, wherein the decoder computes branch metrics associated with transitions between states of a multi-stage trellis representation of a state machine, wherein at least a subset of the branch metrics correspond to a linear distance between a given one of the received symbols and its nearest codeword in a given stage of the trellis, and further wherein the decoder utilizes the linear distance branch metrics for a current stage of the trellis, and a path metric generated for a previous stage of the trellis, for comparison purposes in determining a survivor path and corresponding updated path metric for the current stage of the trellis, and generates an output for a given stage of the multi-stage trellis based on the path metric determined for that stage, such that the decoder achieves a level of performance with the linear distance branch metrics which is substantially equivalent to that achieved using squared distance branch metrics.

11. A decoder for processing a sequence of received symbols, the decoder comprising:
means for computing branch metrics associated with transitions between states of a multi-stage trellis representation of a state machine, wherein at least a subset of the branch metrics correspond to a linear distance between a given one of the received symbols and its nearest codeword in a given stage of the trellis;

means for utilizing the linear distance branch metrics for a current stage of the trellis, and a path metric generated for a previous stage of the trellis, for comparison purposes in determining a survivor path and corresponding updated path metric for the current stage of the trellis, such that a level of performance achieved using the linear distance branch metrics is substantially equivalent to that achieved using squared distance branch metrics; and means for generating an output for a given stage of the multi-stage trellis based on the path metric determined for that stage.

12. A method of processing a sequence of received symbols, the method comprising the steps of:

computing branch metrics associated with transitions between states of a multi-stage trellis representation of a state machine, wherein at least a subset of the branch metrics correspond to a linear distance between a given one of the received symbols and its nearest codeword in a given stage of the trellis;

utilizing the linear distance branch metrics for a current stage of the trellis, and a path metric generated for a previous stage of the trellis, for comparison purposes in determining a survivor path and corresponding updated path metric for the current stage of the trellis, such that a level of performance achieved using the linear distance branch metrics is substantially equivalent to that achieved using squared distance branch metrics; and generating an output for a given stage of the multi-stage trellis based on the path metric determined for that stage.

13. The method of claim 12 wherein the symbols are generated in accordance with a QPSK modulation constellation.

14. The method of claim 12 wherein the symbols are generated in accordance with a QAM modulation constellation.

15. The method of claim 12 wherein a given one of the linear distance branch metrics corresponding to a transition from state i to state j in stage n of the trellis is represented as $$B_{i,j,n,1} = -y_{n,1} p_{i,j,n,1} = \begin{cases} -y_{n,1} & \text{for } p_{i,j,n,1} = 1 \\ y_{n,1} & \text{for } p_{i,j,n,1} = -1, \end{cases}$$

where $y_{n,m}$ denotes an $m^{th}$-dimensional received symbol at stage n, $p_{i,j,n,m}$ denotes a nearest codeword in a coset $C_{i,j}$ to the $m^{th}$-dimensional received symbol, $y_{n,m}$, at stage n, and $B_{i,j,n,m}$ denotes an $m^{th}$-dimensional branch metric for the transition from state i to state j at stage n.

16. The method of claim 15 wherein the survivor path is determined by computing $$\Delta M = M_{i,n-1} + \sum_{m=1}^{2} B_{i,j,n,m} - \left( M_{k,n-1} + \sum_{m=1}^{2} B_{k,j,n,m} \right),$$

where $M_{j,n}$ denotes a path metric for state j at stage n, k denotes a numerical index, and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{2} B_{i,j,n,m}.$$

17. The method of claim 12 wherein a given one of the linear distance branch metrics corresponding to a transition from state i to state j in stage n of the trellis is represented as $$B_{i,j,n} = \sum_{m=1}^{N} |y_{n,m} - p_{i,j,n,m}|,$$

where $y_{n,m}$ denotes an $m^{th}$-dimensional received symbol at stage n, $p_{i,j,n,m}$ denotes a nearest codeword in a coset $C_{i,j}$ to the $m^{th}$-dimensional received symbol, $y_{n,m}$, at stage n, and $B_{i,j,n}$ denotes a branch metric for the transition from state i to state j at stage n.

18. The method of claim 17 wherein the survivor path is determined by computing $$\Delta M = (M_{i,n-1} - M_{k,n-1}) + \sum_{m=1}^{N} |y_{n,m} - p_{i,j,n,m}| - \sum_{m=1}^{N} |y_{n,m} - p_{k,j,n,m}|,$$

where $M_{j,n}$ denotes a path metric for state j at stage n, k denotes a numerical index, and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{N} B_{i,j,n,m},$$

where $B_{i,j,n,m}$ denotes an $m^{th}$-dimensional branch metric for the transition from state i to state j at stage n.

19. The method of claim 17 wherein the survivor path is determined by computing $$\Delta M = (M_{i,n-1} - M_{k,n-1}) + \sum_{m=1}^{N} |y_{n,m} - p_{i,j,n,m}| - \sum_{m=1}^{N} |y_{n,m} - p_{k,j,n,m}|,$$

where $M_{j,n}$ denotes a path metric for state j at stage n, k denotes a numerical index, and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{N} \left( p_{i,j,n,m} \left( \frac{p_{i,j,n,m}}{2} - y_{n,m} \right) \right).$$

20. The method of claim 17 wherein the survivor path is determined by computing one of $$\Delta M = (M_{i,n-1} - M_{k,n-1}) - \sum_{m=1}^{N}((y_{n,m} - p_{i,j,n,m}) + (y_{n,m} - p_{k,j,n,m}))$$

or $$\Delta M = (M_{i,n-1} - M_{k,n-1}) + \sum_{m=1}^{N}((y_{n,m} - p_{i,j,n,m}) + (y_{n,m} - p_{k,j,n,m})),$$

where $M_{j,n}$ denotes a path metric for state j at stage n, k denotes a numerical index, and $\Delta M$ denotes a path metric difference, and further wherein if the path from state i to state j is the optimum path coming into state j at stage n, the updated path metric at stage n is given by $$M_{j,n} = M_{i,n-1} + \sum_{m=1}^{N}\left(p_{i,j,n,m}\left(\frac{p_{i,j,n,m}}{2} - y_{n,m}\right)\right).$$

* * * * *